United States Patent
Laighton et al.

(10) Patent No.: US 10,263,566 B1
(45) Date of Patent: Apr. 16, 2019

(54) RADIO FREQUENCY POWER AMPLIFIER

(71) Applicant: Raytheon Company, Waltham, MA (US)

(72) Inventors: Christopher M. Laighton, Boxborough, MA (US); Alan J. Bielunis, Hampstead, NH (US); Edward A. Watters, Carlisle, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 15/718,504

(22) Filed: Sep. 28, 2017

(51) Int. Cl.
 *H03F 1/02* (2006.01)
 *H03F 3/195* (2006.01)
 *H03F 3/213* (2006.01)

(52) U.S. Cl.
 CPC .......... *H03F 1/0205* (2013.01); *H03F 3/195* (2013.01); *H03F 3/213* (2013.01); *H03F 2200/225* (2013.01); *H03F 2200/391* (2013.01); *H03F 2200/451* (2013.01); *H03F 2200/465* (2013.01)

(58) Field of Classification Search
 USPC .......................... 330/285, 296, 277, 136, 298
 See application file for complete search history.

(56) References Cited

U.S. PATENT DOCUMENTS

| 5,892,400 | A | 4/1999 | van Saders et al. |
| 2016/0373074 | A1 | 12/2016 | Bettencourt et al. |

FOREIGN PATENT DOCUMENTS

JP 06303043 10/1994

OTHER PUBLICATIONS

Notification of Transmittal of the International Search Report and Written Opinion of the ISA dated Oct. 17, 2018 for International Application No. PCT/US2018/044516; 1 Page.
International Search Report dated Oct. 17, 2018 for International Application No. PCT/US2018/044516; 9 Pages.
Written Opinion of the ISA dated Oct. 17, 2018 for International Application No. PCT/US2018/044516; 7 Pages.

*Primary Examiner* — Hieu P Nguyen
(74) *Attorney, Agent, or Firm* — Daly, Crowley, Mofford & Durkee, LLP

(57) ABSTRACT

An amplifier having a Radio Frequency (RF) power level detector circuit for producing a control signal in accordance with a power level of an RF input signal. The control signal indicates whether the power level of the input signal is within a predetermined range of power levels greater than zero. A bias circuit is fed by the control signal, for producing a fixed bias voltage at a gate electrode of a field effect transistor (FET) to establish a predetermined quiescent current for the FET when the control signal indicates the power level of the RF input signal is within the predetermined range of power levels and to reduce the bias voltage to reduce the predetermined quiescent current when the control signal indicates the power level of the RF input signal is below the predetermined range of power levels.

4 Claims, 3 Drawing Sheets

RADIO FREQUENCY POWER AMPLIFIER

TECHNICAL FIELD

This disclosure relates generally to Radio Frequency (RF) amplifiers and more particularly to high power RF amplifiers.

BACKGROUND

As is known in the art, many radar systems use Radio Frequency (RF), Monolithic Microwave Integrated Circuit (MMIC) Power Amplifiers. One such amplifier is shown in FIG. 1. Here, the power amplifier includes a common source connected output Field Effect Transistor (FET) $Q_{OUT}$ having its gate fed by an input radio frequency signal (RF IN) to produce an output signal RF OUT at the drain of the $Q_{OUT}$. A bias circuit is provided to produce a reference current Iref which produces a predetermined fixed bias voltage at the gate of the output FET and establishes a predetermined drain current (called the quiescent drain current, Idq, the drain current drawn by the output FET when no RF input is applied to the FET that will result in the output FET producing optimum RF amplification performance when an RF input is applied to the FET).

As is also known, the amount of power dissipated in $Q_{OUT}$ is equal to the sum of the DC power applied to the output FET $Q_{OUT}$ (the product of the drain voltage $V_{DD}$ and drain current) and the amount of RF power applied to the output FET the $Q_{OUT}$ minus the amount of power produced at the output of the output FET $Q_{OUT}$. Thus, even in the absence of RF input signal, there is power dissipated by the output FET (the dissipated power being the product of the drain voltage $V_{DD}$ and quiescent drain current, Idq). For example, for a 1 mm MMIC output FET device biased at Idq=100 mA/mm and with a drain voltage of 20 Volts, the amplifier will dissipate: 1*(0.1)*20=2 Watts. When RF input signal is fully applied, an increase in current $Q_{OUT}$ will take place at the same time that output power is delivered out of the circuit. In most cases, this means that there will be a decrease in dissipated power in the output FET $Q_{OUT}$. For example, if the RF driven current (the drain current of FET $Q_{OUT}$) rises by 30% (130 mA) but the output power is 1 Watt for an input of 0.1 Watts, the resulting dissipation in the amplifier will be 0.13 A*20V (DC input power)+0.1 Watt (RF Input Power)−1 Watt (Output Power)=1.7 Watts. The output FET temperature directly correlates to the FET dissipated power. Higher power dissipation causes a higher channel temperature. Higher channel temperatures can either shorten the lifetime of the output FET or can cause immediate failure of the device.

As is also known, in MMIC FET power amplifiers, it is undesirable to turn the drain "on" (conducting) for any appreciable time before applying an RF Input signal as the efficiency of the amplifier is zero for that period of time and the dissipated power on the RF FETs is relatively high. Thus, the gate biasing circuit is provided to set the gate voltage at a predetermined level selected to produce a predetermined quiescent drain current, Idq, density (current per unit FET area) even in the absence of an applied RF input signal so that during application of the RF input signal the RF FET $Q_{OUT}$ will have a specific drain current density target.

SUMMARY

In accordance with the present disclosure, an amplifier, comprising: a Field Effect Transistor (FET); a Radio Frequency (RF) power level detector circuit for producing a control signal in accordance with a power level of an RF input signal, such control signal indicating whether the power level of the input signal is within a predetermined range of power levels greater than zero; and a bias circuit, fed by the control signal, for producing a fixed bias voltage at a gate electrode of the FET to establish a predetermined quiescent current for the FET when the control signal indicates the power level of the RF input signal is within the predetermined range of power levels greater than zero and to reduce the bias voltage to reduce the predetermined quiescent current when the control signal indicates the power level of the RF input signal is below the predetermined range of power levels.

With such an arrangement, in the absence of the RF input signal (that is, when the input signal has a power level less than the predetermined power level) the power dissipation in the output FET is zero. When RF input signal is applied to the amplifier, the gate voltage of the output FET then changes to the voltage that would produce the predetermined quiescent drain current, Idq to produce optimum RF amplification performance. More particularly, the circuit detects when a relatively low power level input power is incident on an amplifier (such as in the case where there is the absence of an RF input signal applied to the amplifier) and pinches off the output FET to a lower power dissipation condition compared with that dissipated when the RF input signal is applied. When the proper high power level of input power is detected, the gate of the output FET is biased to its normal high efficiency RF setting. This protects the amplifier from a pure dissipation condition that can destroy the output FET. The circuit uses an RF power sensor to sense the level of the RF input power incident on the amplifier and produces a DC bias signal at the gate of the output FET. For high power levels, the circuit applies normal RF operational gate bias voltage to the output FET. If low power is incident on the amplifier, the control signal results in the circuit producing a large negative voltage on the output FET gate to pinch the output FET devices to an "off", non-conduction condition.

In one embodiment, an amplifier is provided having a RF power level detector circuit a control circuit fed by an input signal, for producing a control signal in accordance with a power level of an RF input signal, such control signal indicating whether the power level of the input signal is within a predetermined range of power levels, The amplifier includes an amplifier section having: a field effect transistor having a gate for controlling a flow of carriers between a drain and a source of the field effect transistor; and a voltage source coupled to the drain; a reference potential connected to the source. The drain provides an output for the amplifier section. The input signal is fed to the gate. A bias circuit is fed by the control circuit for producing a fixed bias to the gate to establish a predetermined drain quiescent current (Idq) for the field effect transistor when the control signal indicates the power level of the RF input signal is within the predetermined range of power levels greater than zero and to reduce the bias voltage to reduce the predetermined quiescent current when the control signal indicates the power level of the RF input signal is below the predetermined range of power levels.

In one embodiment, the Field Effect Transistor (FET), the Radio Frequency (RF) power level detector circuit; and the bias circuit, are formed on a single Monolithic Microwave Integrated Circuit (MMIC) chip.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

Like reference symbols in the various drawings indicate like elements.

DETAILED DESCRIPTION

Figure 1:
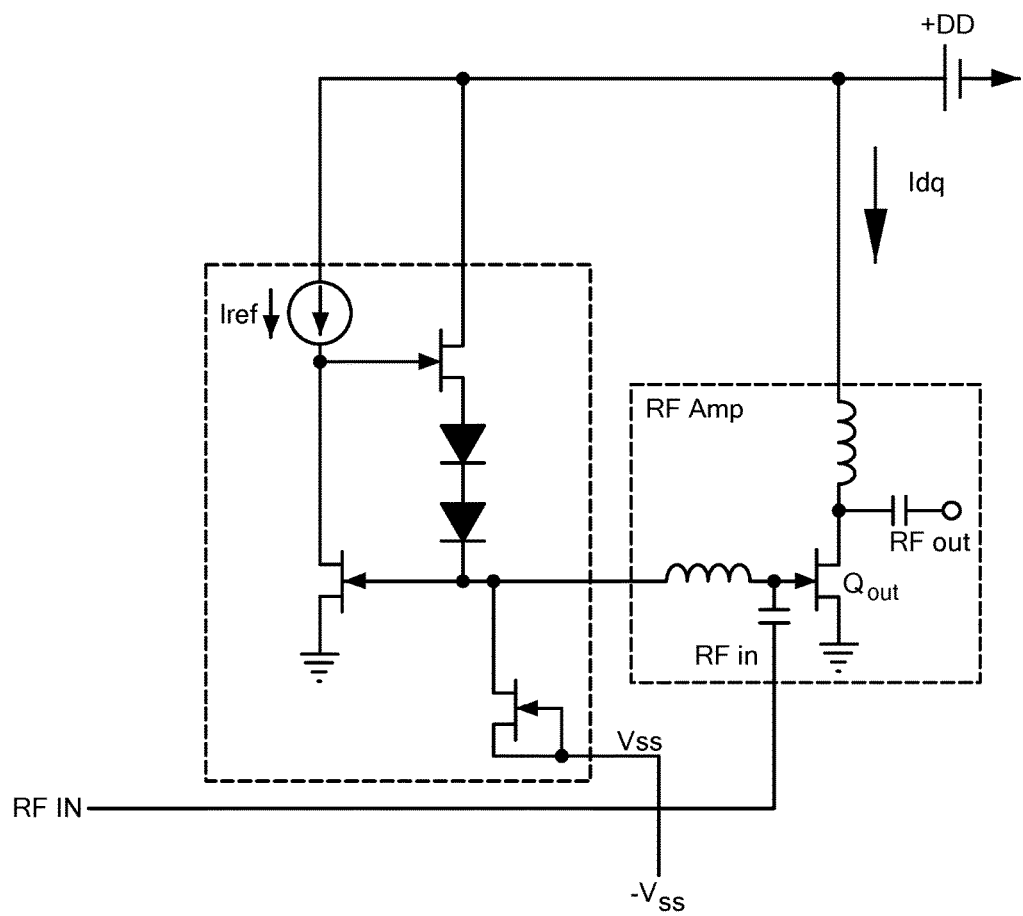
FIG. 1 is a diagrammatical sketch of a high power amplifier according to the PRIOR ART.
Figure 2:
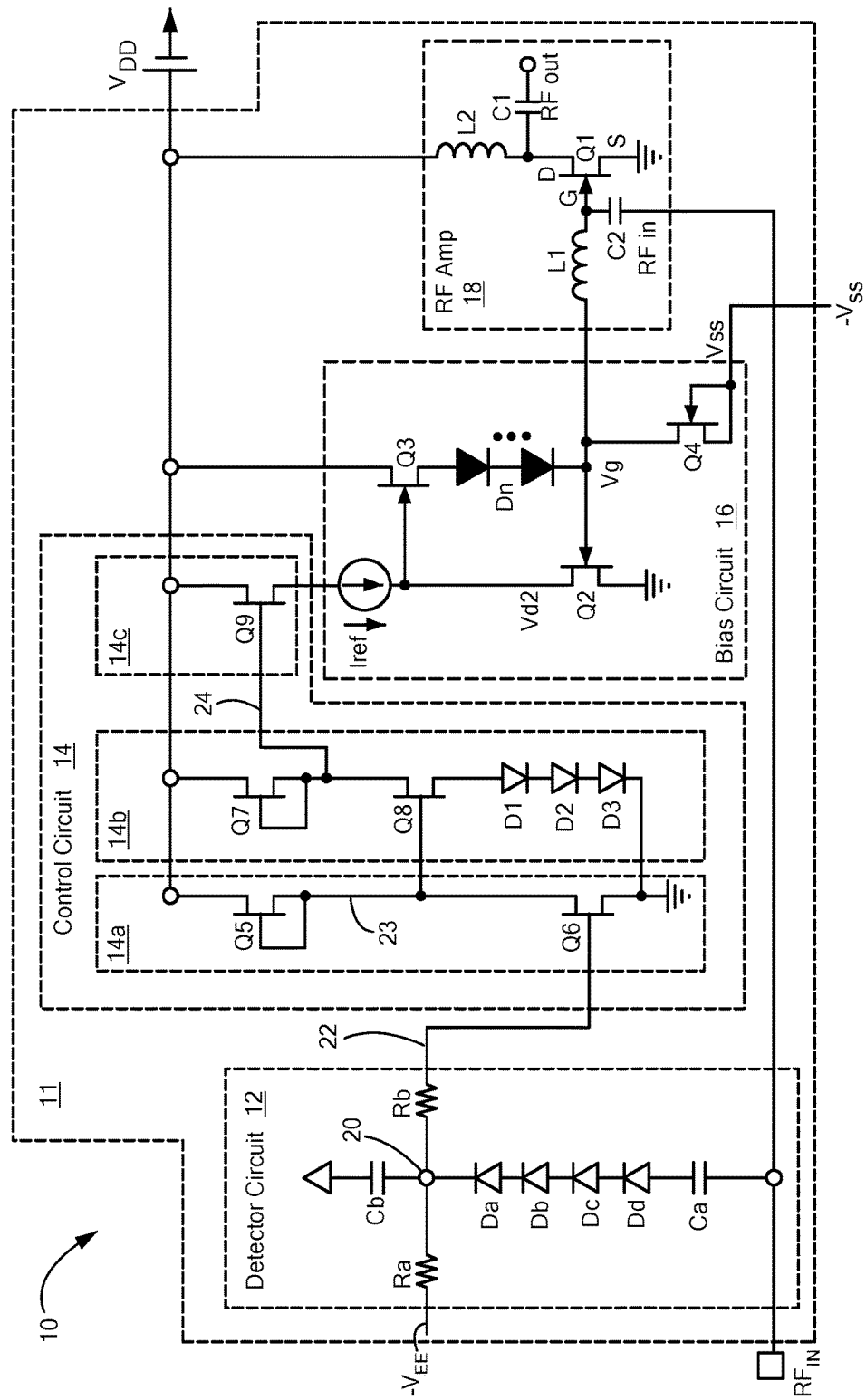
FIG. 2 is an RF power amplifier circuit according to the disclosure.

Referring now to FIG. 2, an amplifier circuit 10 is shown to include: an RF power level detector circuit 12; a control circuit 14; a bias circuit 16; and an RF amplifier 18, arranged as shown, all formed on Monolithic Microwave Integrated Circuit (MMIC) chip 11.

The power amplifier 18 includes an output, depletion mode transistor Field Effect Transistor (FET) Q1 having a gate (G) for controlling a flow of carriers between a source (S) of the FET Q1 and the drain (D) of the FET Q1. The bias circuit 16 is coupled to the gate (G) through an inductor L1, as shown. A voltage source $+V_{DD}$ is connected to the drain (D) though an inductor L2, as shown. The source (S) is connected to a reference potential, here ground, (sometimes referred to as a common source connected FET). The drain (D) provides an output RF OUT for the amplifier 18 through capacitor C1, as shown. An input signal $RF_{IN}$ is fed to the gate electrode through a capacitor C2, as shown.

Figure 3:
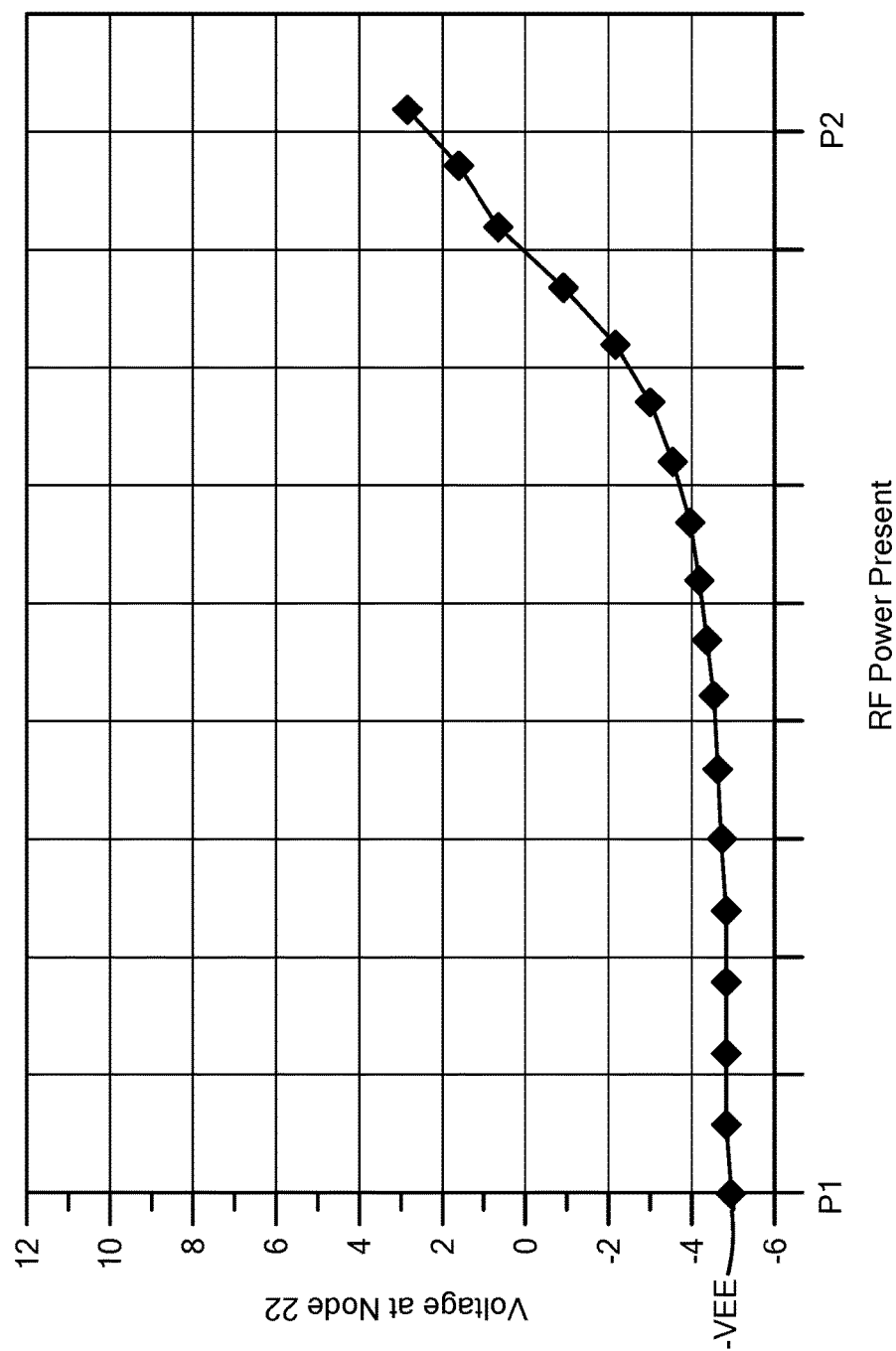
FIG. 3 is a graph showing the relationship between a control signal produced by an RF power level detector circuit used in the RF power amplifier circuit of FIG. 2 and RF signal input power of an RF input signal fed to the RF power amplifier of FIG. 1.

The RF power level detector circuit 12 includes a plurality of serially connected diodes Da-Dd connected between $RF_{IN}$ and a terminal 20 through a dc blocking capacitor Ca, as shown. The terminal 20 is connected to: a voltage source −VEE, here, for example −5V volts relative to reference potential, here ground, through a resistor Ra; to the reference potential through a capacitor Cb; and to an output mode, or terminal, 22, through a resistor Rb, as shown. The RF power level detector circuit 12 produces a control signal at terminal 22 in accordance with a power level of an RF input signal fed to the input $RF_{IN}$. The control signal indicates whether the power level of the input signal is within a predetermined range of power levels greater than zero. More particularly, as shown in FIG. 3, the control signal (voltage) at terminal 22 is −VEE in the absence of an RF signal being applied to terminal $RF_{IN}$ (the RF input signal power level is zero) and the control signal at terminal 22 is more positive than −VEE over the predetermined range of power levels ranging from power level P1 (established by the number of serially connected diodes) to a greater power level P2 where P1 is greater than zero; that is, when the input RF is present. The range between P1 and P2 is selected to prevent the power dissipation within the FET $Q_1$, even in the absence of an RF input signal, from being no higher than the power dissipated under full RF drive, where the power dissipated under full RF drive is equal to the sum of the DC power applied to the output FET $Q_1$ (the product of the drain voltage $V_{DD}$ and drain current) and the amount of RF power applied to the output FET $Q_1$ minus the amount of power produced at the output of the output FET $Q_1$.

The control circuit 14 (FIG. 2) includes: a voltage level shifting section 14a comprising: a depletion mode FET Q5 configured as a current source and a depletion mode FET Q6 configured as a switch connected between $+V_{DD}$ and ground, for shifting the voltages input level swing at terminal 22 from between −VEE and a voltage above ground (as discussed in connection with FIG. 3) to an output voltage swing at terminal 23 between $+V_{DD}$ (in the absence of an RF input signal) and ground; and a voltage inverter section 14b comprising: a depletion mode FET Q7 configured as a current source; a depletion mode FET Q8 configured as a switch and a plurality of diodes, here for example three diodes in D1-3, serially connected between $V_{DD}$ and ground, as shown, to invert the voltage signal at terminal 23 and produce such inverted voltage swing at terminal 24; and a switch section 14c, comprising a depletion mode FET (Q9) connected between $V_{DD}$ and the bias circuit 16, as shown. When the switch 14c is closed, as when the control signal at terminal 22 indicates the power level of the RF input at terminal $RF_{IN}$ is greater than the predetermined power level (that the RF input signal is present), the control circuit 14 allows the bias circuit 16 to operate normally and produce a predetermined gate bias voltage for the amplifier 18 to that a predetermined quiescent drain current, $I_{dq}$, passes from $+V_{DD}$ to the drain (D) of FET Q1; and, on the other hand, when the switch 14c is open, as when the control signal at terminal 22 indicates the power level of the RF input at terminal $RF_{IN}$ is at or below the predetermined power level (the RF input signal is absent), the control circuit 14 transistor Q9 becomes non-conducting. As will be described in more detail below in connection with bias circuit 16, when FET Q9 is off (non-conducting), the gate (G) of FET Q1 goes to $-V_{SS}$ (here −5 volts) and pinches off FET Q1 with the result that quiescent drain current, $I_{dq}$, is removed (goes to zero).

The bias circuit 16, comprises: a current mirror having: a current source $I_{ref}$ and biasing circuitry (depletion mode transistors Q2, Q3, and Q4 and diodes Dn) arranged as shown, coupled to the current source $I_{ref}$ and between the potential more positive than the reference potential ($+V_{DD}$) and a potential more negative than the reference potential; coupled to a potential more negative than the reference potential ($-V_{SS}$). It should be noted that the diodes Dn is a series of a plurality n of diodes GaN diodes Dn, where n is the number of diodes in the series selected in accordance with the voltages used, here for example, $V_{DD}$ is 24 volts and $-V_{SS}$ is −8.0 volts. One such circuit is described in U. S. Patent Application Publication No. US 2016/0373074 A1 Published Dec. 22, 2016, inventors Bettencourt et al, assigned to the same assignee as the present patent application. The bias circuit 16 is a depletion mode current mirror circuit for quiescent bias control of the amplifier 18 where Q2 is a Gallium Nitride (GaN) mirror FET and Q1 is the GaN HEMT. The reference current source Iref fed to FET Q2 controls the quiescent current $I_{dq}$ for FET Q1. The current source $I_{ref}$ may be a saturated resistor as described in U.S. Pat. No. 8,854,140 or a linear resistor, transistor or from an off chip reference if needed.

Thus, RF power level detector circuit 12 produces a control signal at terminal 22 in accordance with a power level of an RF input signal applied to the power amplifier 10. The control signal indicates whether the RF input signal is being applied to the power amplifier 18 is within the predetermined range of power levels or less than the predetermined power level (in absence of such RF signal being applied to the power amplifier 10). After passing through the control circuit 14, the bias circuit 16 produces a predetermined gate bias voltage (Vg) at a gate of the output FET to establish a predetermined constant quiescent drain current, Idq, during a period of time when the RF input signal is indicated as being present (the power level is within the predetermined range of power levels) and applies a more negative voltage at a gate of the output FET and hence removes quiescent drain current, Idq when the control signal indicates the absence of such RF signal (the power level is less than the predetermined range of power levels). More particularly, when the switch 14c (FET Q9) is closed, as when the control signal at terminal 22 indicates the power level of the RF input at terminal $RF_{IN}$ is within the predetermined power level, FET Q9 conducts and Iref passes to FETS Q2 and Q3 to produce the predetermined bias voltage at the gate of FET Q1 establishing the predetermined quiescent drain current, $I_{dq}$, for FET Q1; and, on the other hand, when the control signal at terminal 22 indicates the power level of the RF input at terminal $RF_{IN}$ is at or below the predetermined power level (the RF input signal is absent), FET Q9 is non-conducting and the gate (G) of FET Q1 goes to $-V_{SS}$ (here −8 volts) and pinches off FET Q1 with the result that quiescent drain current, $I_{dq}$, is removed (goes to zero).

A number of embodiments of the disclosure have been described. Nevertheless, it will be understood that various modifications may be made without departing from the spirit and scope of the disclosure. For example other RF power detector circuits may be used to detect the presence or absence of the RF input signal. Accordingly, other embodiments are within the scope of the following claims.

What is claimed is:

1. An amplifier, comprising:
   a Field Effect Transistor (FET);
   a Radio Frequency (RF) power level detector circuit for producing a control signal in accordance with a power level of an RF input signal, such control signal indicating whether the power level of the RF input signal is within a predetermined range of power levels greater than zero; and
   a bias circuit, connected to a voltage source and fed by the control signal, for producing a fixed bias voltage at a gate electrode of the FET to establish a predetermined quiescent current for the FET when the control signal indicates the power level of the RF input signal is within the predetermined range of power levels greater than zero while the bias circuit is connected to the voltage source and to reduce the bias voltage to reduce the predetermined quiescent current when the control signal indicates the power level of the RF input signal is below the predetermined range of power levels while the bias circuit is connected to the voltage source.

2. An amplifier, comprising:
   a RF power level detector circuit/a control circuit fed by an RF input signal, for producing a control signal in accordance with a power level of the RF input signal, such control signal indicating whether the power level of the RF input signal is within a predetermined range of power levels greater than zero;
   an amplifier section, comprising:
      a field effect transistor having a gate for controlling a flow of carriers between a drain and a source of the field effect transistor; and
      a voltage source coupled to the drain;
      a reference potential connected to the source;
      wherein the drain provides an output for the amplifier section; and wherein the RF input signal is fed to the gate; and
   a bias circuit, connected to a voltage source and fed by the control circuit for producing a fixed bias to the gate to establish a predetermined drain quiescent current (Idq) for the field effect transistor when the control signal indicates the power level of the RF input signal is within the predetermined range of power levels while the bias circuit is connected to the voltage source and to reduce the bias voltage to reduce the predetermined quiescent current when the control signal indicates the power level of the RF input signal is below the predetermined range of power levels while the bias circuit is connected to the voltage source.

3. The amplifier recited in claim 1 wherein the Field Effect Transistor (FET), the Radio Frequency (RF) power level detector circuit; and the bias circuit, are formed on a single Monolithic Microwave Integrated Circuit (MMIC) chip.

4. The amplifier recited in claim 2 wherein the RF power level detector circuit/a control circuit, the amplifier section, and the bias circuit, are formed on a single Monolithic Microwave Integrated Circuit (MMIC) chip.

* * * * *